United States Patent
Chen et al.

(10) Patent No.: US 9,768,140 B2
(45) Date of Patent: Sep. 19, 2017

(54) METHOD FOR FABRICATING PACKAGE STRUCTURE

(71) Applicant: Siliconware Precision Industries Co., Ltd., Taichung (TW)

(72) Inventors: Yan-Heng Chen, Taichung (TW); Mu-Hsuan Chan, Taichung (TW); Chieh-Yuan Chi, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/515,922

(22) Filed: Oct. 16, 2014

(65) Prior Publication Data
US 2016/0049376 A1    Feb. 18, 2016

(30) Foreign Application Priority Data
Aug. 15, 2014  (TW) .............................. 103128050 A

(51) Int. Cl.
| H01L 21/00 | (2006.01) |
| H01L 23/00 | (2006.01) |
| H01L 21/56 | (2006.01) |
| H01L 21/311 | (2006.01) |
| H01L 23/31 | (2006.01) |

(52) U.S. Cl.
CPC .......... *H01L 24/19* (2013.01); *H01L 21/561* (2013.01); *H01L 24/20* (2013.01); *H01L 21/31144* (2013.01); *H01L 21/568* (2013.01); *H01L 23/3128* (2013.01); *H01L 2224/04105* (2013.01); *H01L 2224/12105* (2013.01); *H01L 2225/1035* (2013.01); *H01L 2924/37001* (2013.01)

(58) Field of Classification Search
CPC .......... H05B 6/6447; H05B 6/80; H05B 3/00; H01L 25/05; H01L 25/105; H01L 2924/0002; H01L 2924/0001; H01L 21/50; H01L 21/67288; H01L 21/67242; H01L 22/34; H01L 22/30; H01L 22/32; H01L 2225/1058
USPC ......... 438/5, 12, 14, 17, 108, 109, 455–459, 438/614; 257/48, 415, 703, 759, 257/E21.531, E21.522, E21.524, E21.499; 219/201, 600; 324/718, 754, 765
See application file for complete search history.

(56) References Cited

U.S. PATENT DOCUMENTS 5,353,498 A * 10/1994 Fillion ............... H01L 21/568
257/E21.505
6,242,299 B1 * 6/2001 Hickert ............ H01L 27/11502
257/E21.009

(Continued)

*Primary Examiner* — Yuanda Zhang
*Assistant Examiner* — Sheikh Maruf
(74) *Attorney, Agent, or Firm* — Mintz Levin Cohn Ferris Glovsky and Popeo, P.C.; Peter F. Corless; Steven M. Jensen

(57) ABSTRACT

A method for fabricating a package structure is provided, which includes the steps of: providing an encapsulant encapsulating at least an electronic element; forming a shaping layer on a surface of the encapsulant, wherein the shaping layer has at least an opening exposing a portion of the surface of the encapsulant; forming at least a through hole corresponding in position to the opening and penetrating the encapsulant; and forming a conductor in the through hole. The shaping layer facilitates to prevent deformation of the through hole.

11 Claims, 6 Drawing Sheets

(56) References Cited

U.S. PATENT DOCUMENTS

| | | | | |
|---|---|---|---|---|
| 6,773,986 B2* | 8/2004 | Bruchhaus | ........ | H01L 27/11502 257/E21.009 |
| 8,227,338 B1* | 7/2012 | Scanlan | ............. | H01L 21/4857 438/637 |
| 8,535,980 B2* | 9/2013 | Chua | .................... | H01L 21/486 408/113 |
| 8,563,433 B2* | 10/2013 | Kosaka | ............... | H01L 21/3065 257/E21.023 |
| 2003/0129796 A1* | 7/2003 | Bruchhaus | ........ | H01L 27/11502 438/239 |
| 2004/0262655 A1* | 12/2004 | Kweon | .................. | H01L 28/75 257/295 |
| 2006/0046317 A1* | 3/2006 | Bruchhaus | ......... | H01L 27/11507 438/3 |
| 2008/0064163 A1* | 3/2008 | Coolbaugh | ......... | H01L 23/5223 438/253 |
| 2008/0116580 A1* | 5/2008 | Jiang | .................... | H01L 21/561 257/766 |
| 2008/0265421 A1* | 10/2008 | Brunnbauer | .......... | H01L 21/561 257/758 |
| 2008/0316714 A1* | 12/2008 | Eichelberger | ....... | H01L 21/6835 361/728 |
| 2010/0006994 A1* | 1/2010 | Shim | .................... | H01L 21/561 257/676 |
| 2010/0035384 A1* | 2/2010 | Eichelberger | ....... | H01L 21/6835 438/121 |
| 2010/0148381 A1* | 6/2010 | Mahler | ................. | H01L 21/561 257/794 |
| 2011/0115059 A1* | 5/2011 | Lee | ....................... | H01L 21/561 257/659 |
| 2011/0278736 A1* | 11/2011 | Lin | ........................ | H01L 25/50 257/774 |
| 2012/0032340 A1* | 2/2012 | Choi | ..................... | H01L 21/561 257/774 |
| 2012/0161332 A1* | 6/2012 | Chua | .................... | H01L 21/486 257/774 |
| 2012/0217629 A1* | 8/2012 | Cho | ....................... | H01L 25/16 257/692 |
| 2013/0032952 A1* | 2/2013 | Cho | .................... | H01L 23/49811 257/777 |
| 2014/0035153 A1* | 1/2014 | Mohammed | ...... | H01L 23/49811 257/774 |
| 2015/0194388 A1* | 7/2015 | Pabst | .................... | H01L 23/552 257/659 |
| 2016/0049376 A1* | 2/2016 | Chen | .................... | H01L 21/561 438/106 |

* cited by examiner

METHOD FOR FABRICATING PACKAGE STRUCTURE

CROSS-REFERENCES TO RELATED APPLICATIONS

This application claims under 35 U.S.C. §119(a) the benefit of Taiwanese Application No. 103128050, filed Aug. 15, 2014, the entire contents of which is incorporated herein by reference.

BACKGROUND OF THE INVENTION

1. Field of the Invention

The present invention relates to packaging processes, and more particularly, to a method for fabricating a package structure having at least an electronic element.

2. Description of Related Art

Along with the progress of semiconductor packaging technologies, various package types have been developed for semiconductor devices. To improve electrical performances and save spaces, various 3D packaging technologies such as fan-out package on package (PoP) structures have been developed to meet the requirement of greatly increased I/O counts of semiconductor chips and integrate integrated circuits having different functions in a single package structure. Such a packaging method allows merging of heterogeneous technologies in a system-in-package (SiP) so as to systematically integrate a plurality of electronic elements having different functions, such as a memory, a CPU (Central Processing Unit), a GPU (Graphics Processing Unit), an image application processor and so on, and therefore is applicable to various thin type electronic products.

FIGS. 1A to 1F are schematic cross-sectional views showing a method for fabricating a semiconductor package 1 of a PoP structure according to the prior art.

Referring to FIG. 1A, a semiconductor element 10 such as a chip is disposed on a thermal release layer 110 of a first carrier 11. Then, an encapsulant 13 is formed on the thermal release layer 110 of the first carrier 11 for encapsulating the semiconductor element 10.

Referring to FIG. 1B, a second carrier 12 having a copper foil 120 is provided and disposed on the encapsulant 13 via the copper foil 120.

Referring to FIG. 1C, the first carrier 11 and the thermal release layer 110 are removed to expose the semiconductor element 10 and the encapsulant 13.

Referring to FIG. 1D, a plurality of through holes 130 are formed by laser in the encapsulant 13 at a periphery of the semiconductor element 10.

Referring to FIG. 1E, a plurality of conductive posts 14 are formed in the through holes 130 through the copper foil 120 by electroplating. Then, a plurality of redistribution layers 15 are formed on the encapsulant 13 and electrically connected to the conductive posts 14 and electrode pads 100 of the semiconductor element 10.

Referring to FIG. 1F, the second carrier 12 is removed. Then, a patterned circuit process is performed by using the copper foil 120 so as to form a circuit structure 16. Thereafter, a singulation process is performed.

However, in the above-described method of the semiconductor package 1, when the through holes 130 are formed by laser, walls 130a of the through holes 130 are easily scorched due to a laser thermal effect. Further, during a cleaning process of the through holes 130, the walls 130a of the through holes 130 easily collapse and present an undesired shape, as shown in FIG. 1D', thus adversely affecting the electroplating quality of the conductive posts 14 and consequently reducing the product yield and reliability.

Therefore, how to overcome the above-described drawbacks has become critical.

SUMMARY OF THE INVENTION

In view of the above-described drawbacks, the present invention provides a method for fabricating a package structure, which comprises the steps of: providing an encapsulant having opposite first and second surfaces and encapsulating at least an electronic element, wherein the electronic element has opposite active and inactive surfaces; forming a shaping layer on the first surface of the encapsulant, wherein the shaping layer has at least an opening exposing a portion of the first surface of the encapsulant; forming at least a through hole corresponding in position to the opening and communicating the first and second surfaces of the encapsulant; and forming a conductor in the through hole.

In the above-described method, the encapsulant can be formed by molding or laminating.

In the above-described method, the active surface of the electronic element can be flush with the first surface of the encapsulant.

Before forming the shaping layer, the above-described method can further comprise forming a conductive layer on the second surface of the encapsulant. After forming the conductor, the above-described method can further comprise forming a circuit structure through the conductive layer, wherein the circuit structure is electrically connected to the conductor. The conductive layer can be a metal layer.

In the above-described method, the shaping layer can be a metal layer.

In the above-described method, the through hole can be formed by laser, mechanical drilling or etching.

The above-described method can further comprise removing the shaping layer so as to form a circuit structure on the first surface of the encapsulant, wherein the circuit structure is electrically connected to the conductor and/or the active surface of the electronic element. The circuit structure can comprise at least a redistribution layer.

After forming the conductor, the above-described method can further comprise forming a circuit structure through the shaping layer. The circuit structure can comprise at least a redistribution layer.

Therefore, by forming the shaping layer to absorb the laser thermal effect, the present invention avoids collapse of the wall of the through hole during a cleaning process. As such, the electroplating quality of the conductor is improved so as to increase the product yield and reliability.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2H are schematic cross-sectional views showing a method for fabricating a package structure 2 according to the present invention.

Figure 1A:
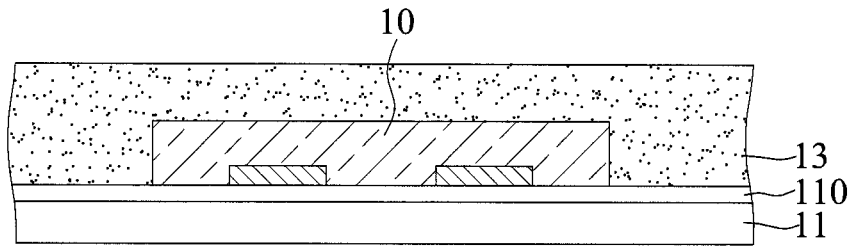
FIGS. 1A to 1F are schematic cross-sectional views showing a method for fabricating a package structure according to the prior art, wherein FIG. 1D' is a schematic upper view of FIG. 1D.
Figure 1B:
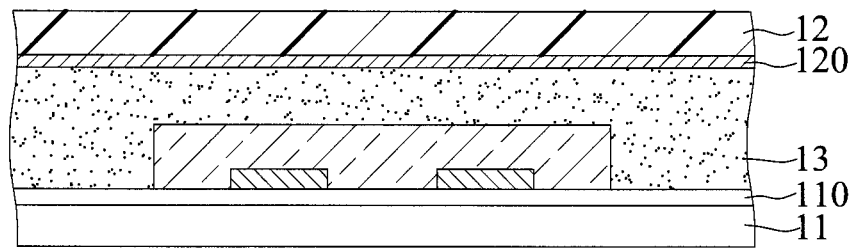
Figure 1C:
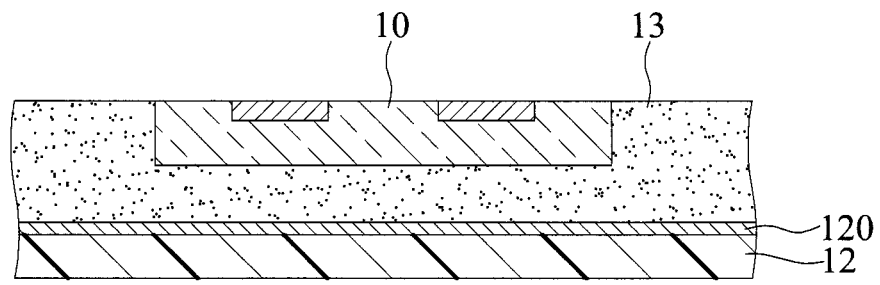
Figure 1D:
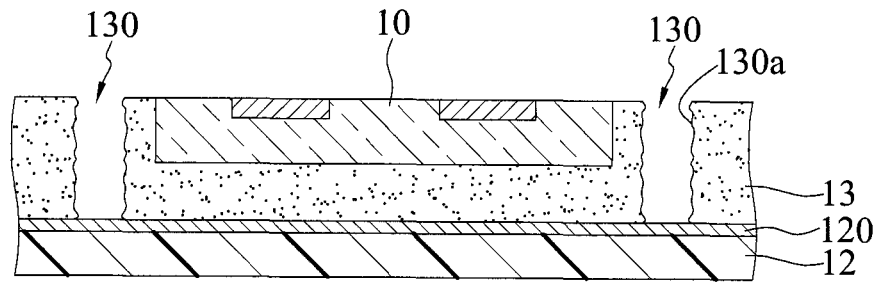
Figure 1D:
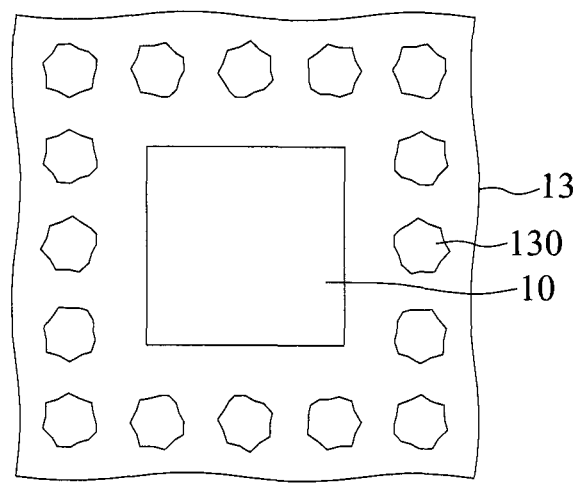
Figure 1E:
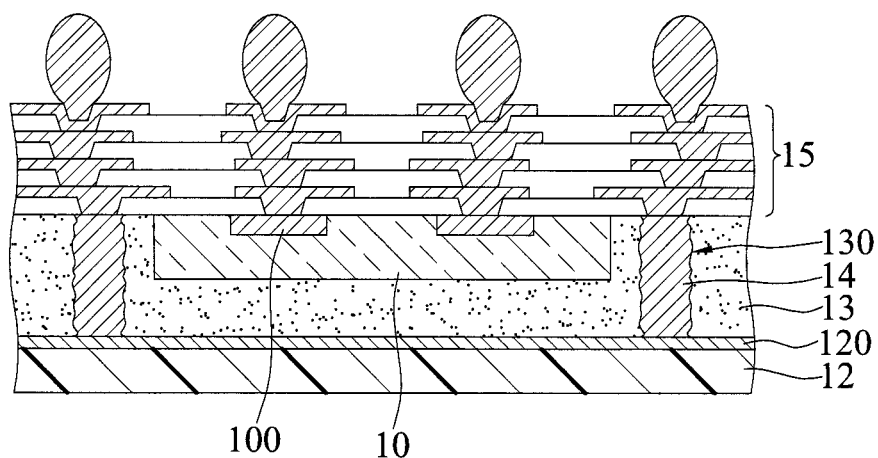
Figure 1F:
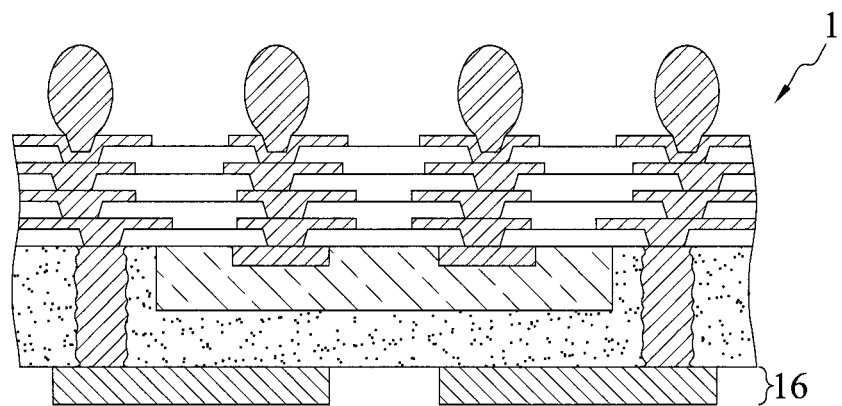
Figure 2A:
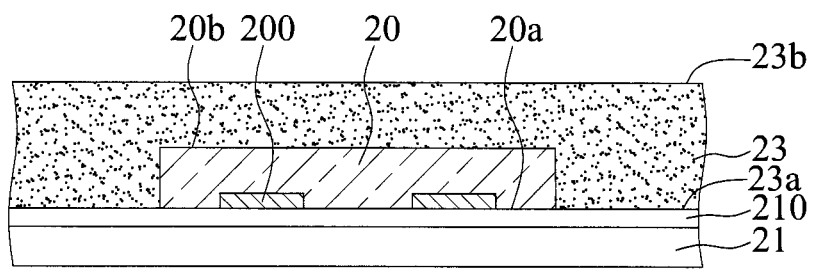
FIGS. 2A to 2H are schematic cross-sectional views showing a method for fabricating a package structure according to the present invention, wherein FIG. 2D' is a schematic upper view of FIG. 2D.

Referring to FIG. 2A, an electronic element 20 is disposed on a release layer 210 of a first carrier 21, and then an encapsulant 23 is formed on the release layer 210 for encapsulating the electronic element 20.

In the present embodiment, the encapsulant 23 is formed by molding or laminating. The encapsulant 23 has a first surface 23a bonded to the release layer 210 and a second surface 23b opposite to the first surface 23a.

Further, the electronic element 20 has an active surface 20a with a plurality of electrode pads 200 and an inactive surface 20b opposite to the active surface 20a. The electronic element 20 is disposed on the release layer 210 via the active surface 20a thereof.

Furthermore, the electronic element 20 is an active element such as a semiconductor chip, a passive element such as a resistor, a capacitor or an inductor, or a combination thereof.

In an embodiment, the encapsulant 23 is thinned to cause the second surface 23b of the encapsulant 23 to be flush with the inactive surface 20b of the electronic element 20.

Figure 2B:
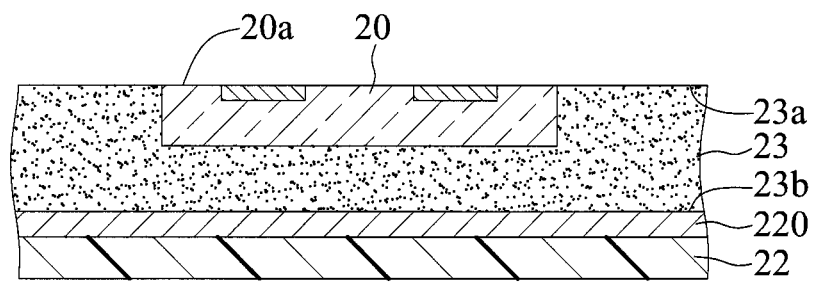

Referring to FIG. 2B, a second carrier 22 having a conductive layer 220 is provided and disposed on the second surface 23b of the encapsulant 23 via the conductive layer 220. Then, the first carrier 21 and the release layer 210 are removed to expose the active surface 20a of the electronic element 20 and the first surface 23a of the encapsulant 23.

Figure 2C:
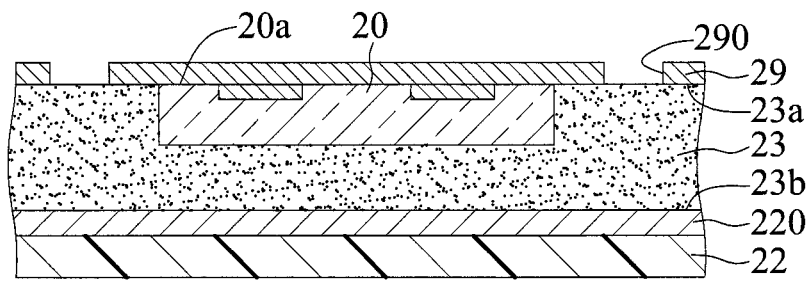

Referring to FIG. 2C, a shaping layer 29 is formed on the active surface 20a of the electronic element 20 and the first surface 23a of the encapsulant 23. The shaping layer 29 has a plurality of openings 290 exposing portions of the first surface 23a of the encapsulant 23.

In the present embodiment, the shaping layer 29 is a metal layer such as a copper layer, and the openings 290 are formed at a periphery of the electronic element 20.

Figure 2D:
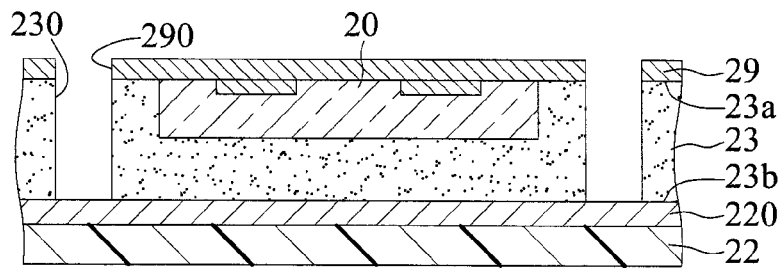
Figure 2D:
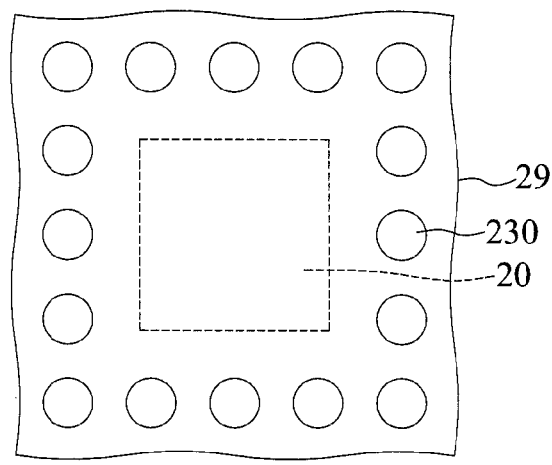

Referring to FIGS. 2D and 2D', a plurality of through holes 230 are formed corresponding in position to the openings 290 and communicating the first and second surfaces 23a, 23b of the encapsulant 23.

In the present embodiment, the through holes 230 are formed in the encapsulant 23 by laser. In other embodiments, the through holes 230 can be formed by mechanical drilling, etching and so on. Further, the material of the shaping layer 29 can be changed according to the practical need.

Figure 2E:
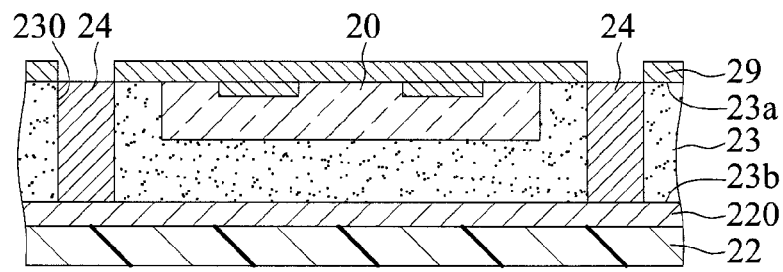

Referring to FIG. 2E, a conductive material containing, for example, copper, aluminum, titanium or a combination of at least two thereof is formed in the through holes 230, thus forming a plurality of conductors 24 having such as a column shape.

Figure 2F:
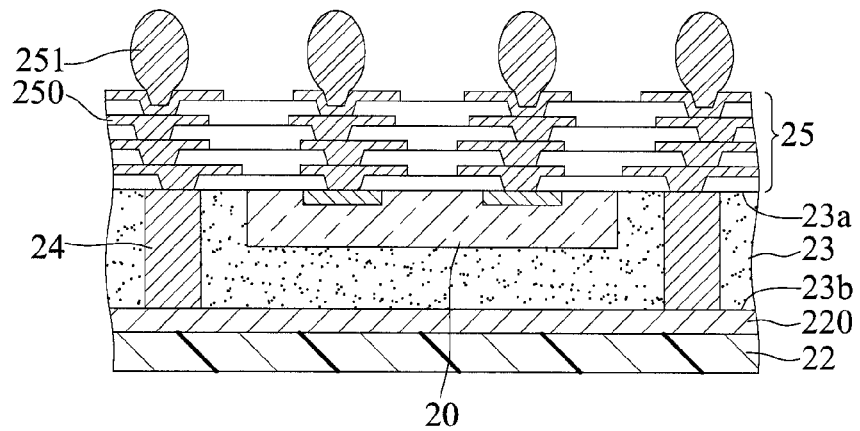

Referring to FIG. 2F, the shaping layer 29 is removed. Then, a circuit structure 25 is formed on the first surface 23a of the encapsulant 23 and electrically connected to the conductors 24 and the electronic element 20.

In the present embodiment, the circuit structure 25 has at least a redistribution layer 250 and a plurality of conductive elements 251 formed on the outermost redistribution layer 250. The conductive elements 251 contain a solder material.

In another embodiment, the circuit structure 25 is formed through the shaping layer 29 by an RDL process. In particular, the shaping layer 29 is etched to form circuits or the shaping layer 29 serves as a seed layer that allows a circuit layer to be formed thereon by electroplating.

Figure 2G:
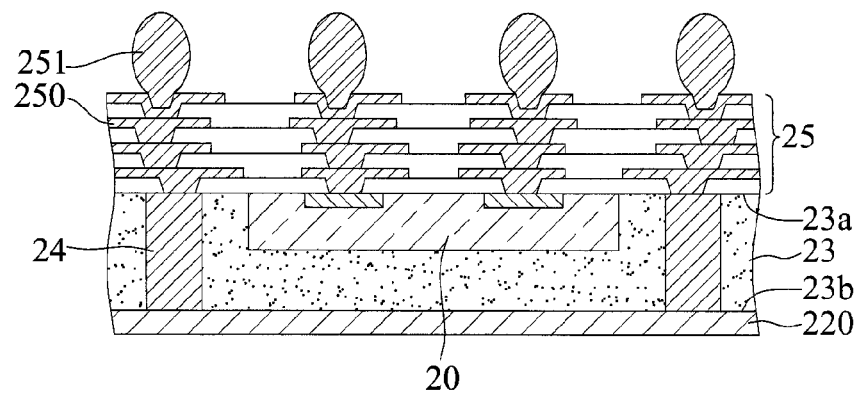

Referring to FIG. 2G, the second carrier 22 is removed but the conductive layer 220 remains.

Figure 2H:
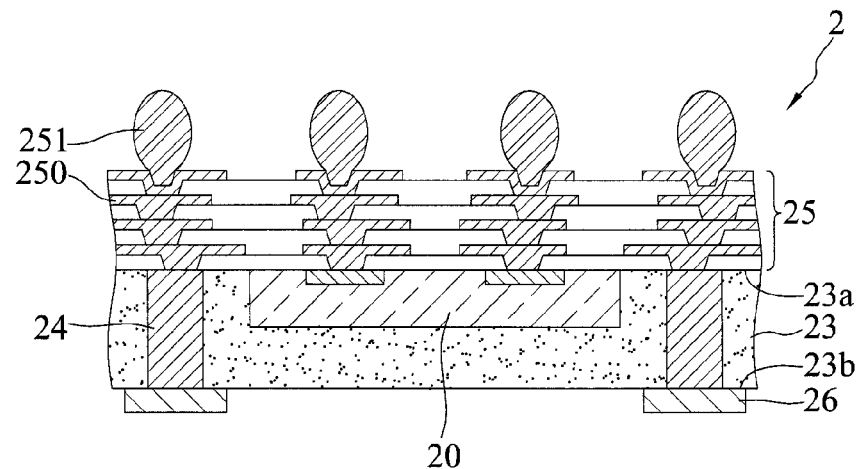

Referring to FIG. 2H, an RDL process is performed through the conductive layer 220 so as to form another circuit structure 26. Then, a singulation process is performed.

Subsequently, the package structure 2 can be mounted on a semiconductor package (not shown) through the conductive elements 251 so as to form a PoP structure.

According to the present invention, the shaping layer 29 is provided to absorb the laser thermal effect so as to prevent the walls of the through holes 230 from collapsing during a cleaning process, thereby keeping integrity of the wall shape of the through holes 230, as shown in FIG. 2D'. Therefore, the electroplating quality of the conductors 24 is improved so as to increase the product yield and reliability.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a package structure, comprising the steps of:
   providing an encapsulant having opposite first and second surfaces and encapsulating at least an electronic element, wherein the electronic element has opposite active and inactive surfaces;
   forming a shaping layer on the first surface of the encapsulant, wherein the shaping layer is a metal layer and has at least an opening exposing a portion of the first surface of the encapsulant;
   after forming the shaping layer on the first surface of the encapsulant, forming at least a through hole corresponding in position to the opening and communicating the first and second surfaces of the encapsulant;
   forming a conductor in the through hole; and
   after forming the conductor in the through hole, removing an entirety of the shaping layer.

2. The method of claim 1, wherein the encapsulant is formed by molding or laminating.

3. The method of claim 1, wherein the active surface of the electronic element is flush with the first surface of the encapsulant.

4. The method of claim 1, before forming the shaping layer, further comprising forming a conductive layer on the second surface of the encapsulant.

5. The method of claim 4, after forming the conductor, further comprising forming a circuit structure through the conductive layer, wherein the circuit structure is electrically connected to the conductor.

6. The method of claim 4, wherein the conductive layer is a metal layer.

7. The method of claim 1, wherein the through hole is formed by laser, mechanical drilling or etching.

8. The method of claim 1, further comprising forming a circuit structure on the first surface of the encapsulant, wherein the circuit structure is electrically connected to the conductor and/or the active surface of the electronic element.

9. The method of claim 8, wherein the circuit structure comprises at least a redistribution layer.

10. The method of claim 1, after forming the conductor, further comprising forming a circuit structure through the shaping layer.

11. The method of claim 10, wherein the circuit structure comprises at least a redistribution layer.

* * * * *